US009647233B2

(12) United States Patent
Kim et al.

(10) Patent No.: US 9,647,233 B2
(45) Date of Patent: May 9, 2017

(54) ORGANIC LIGHT-EMITTING DISPLAY DEVICE (71) Applicant: SAMSUNG DISPLAY CO., LTD., Yongin-si, Gyeonggi-do (KR)

(72) Inventors: Deukjong Kim, Yongin-si (KR); Keunsoo Lee, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 22 days.

(21) Appl. No.: 14/883,248

(22) Filed: Oct. 14, 2015

(65) Prior Publication Data
US 2016/0268540 A1    Sep. 15, 2016

(30) Foreign Application Priority Data
Mar. 9, 2015    (KR) .................. 10-2015-0032507

(51) Int. Cl.
*H01L 51/52* (2006.01)
*H01L 27/32* (2006.01)

(52) U.S. Cl.
CPC ...... *H01L 51/5246* (2013.01); *H01L 27/3276* (2013.01); *H01L 51/5256* (2013.01); *H01L 27/3246* (2013.01)

(58) Field of Classification Search
None
See application file for complete search history.

(56) References Cited

U.S. PATENT DOCUMENTS

| 2008/0054796 A1* | 3/2008 | Sung | H01L 27/3276 313/504 |
| 2009/0153042 A1 | 6/2009 | Izumi et al. | |
| 2009/0179566 A1 | 7/2009 | Imamura | |
| 2014/0027743 A1* | 1/2014 | Nishido | H01L 51/5253 257/40 |
| 2014/0332769 A1 | 11/2014 | Lee et al. | |
| 2015/0091013 A1* | 4/2015 | Bae | H01L 27/3276 257/72 |
| 2015/0116295 A1* | 4/2015 | Pyon | G09G 3/3233 345/211 |
| 2016/0095172 A1* | 3/2016 | Lee | C23C 16/401 313/504 |

FOREIGN PATENT DOCUMENTS

| JP | 2008-165251 A | 7/2008 |
| KR | 20-0207309 Y1 | 12/2000 |
| KR | 10-2009-0064320 A | 6/2009 |
| KR | 10-2014-0133053 A | 11/2014 |

* cited by examiner

Primary Examiner — Joseph Schoenholtz
(74) Attorney, Agent, or Firm — Lewis Roca Rothgerber Christie LLP (57) ABSTRACT An organic light-emitting display device includes: a substrate; a display on the substrate and comprising a display region and a non-display region at a perimeter of the display region; a thin-film encapsulation layer sealing the display; a voltage line at the non-display region and surrounding the display region; and a dam unit overlapping an edge of an outer side of the voltage line, wherein the voltage line comprises: a first voltage line at one side of the display region; and a second voltage line surrounding a pair of first end portions of the first voltage line and other sides of the display region, and an outer side of the first voltage line and an outer side of the second voltage line are on a same line outside the one side of the display region.

15 Claims, 4 Drawing Sheets

ORGANIC LIGHT-EMITTING DISPLAY DEVICE

CROSS-REFERENCE TO RELATED APPLICATION

This application claims priority to and the benefit of Korean Patent Application No. 10-2015-0032507, filed on Mar. 9, 2015, in the Korean Intellectual Property Office, the disclosure of which is incorporated herein in its entirety by reference.

BACKGROUND

1. Field

One or more example embodiments relate to an organic light-emitting display device.

2. Description of the Related Art

An organic light-emitting display device generally includes a hole injection electrode, an electron injection electrode, and an organic light-emitting device that is positioned between the hole injection electrode and the electron injection electrode and includes an organic emission layer. The organic light-emitting display device is a self-emitting display device in which light is generated when excitons generated when holes emitted from the hole injection electrode and electrons emitted from the electron injection electrode are combined in the organic emission layer change from an excited state to a ground state.

Organic light-emitting display devices, which are self-emitting display devices, do not require an additional light source and thus may be driven with a low voltage and manufactured to be light and thin. Also, organic light-emitting display devices have high-quality characteristics compared to other display devices, such as a relatively wide viewing angle, a relatively high contrast, and a relatively high response rate and thus have drawn attention as next-generation display devices. However, because the characteristics of the organic light-emitting device are likely to degrade due to external contaminants, such as moisture, oxygen, etc., protecting organic light-emitting devices from such external contaminants may increase their lifespan.

SUMMARY

One or more example embodiments include an organic light-emitting display device that may be protected from foreign substances or external contaminants such as moisture or oxygen.

Additional aspects will be set forth in part in the description which follows and, in part, will be apparent from the description, or may be learned by practice of the presented embodiments.

According to one or more example embodiments, an organic light-emitting display device includes: a substrate; a display on the substrate and comprising a display region and a non-display region at a perimeter of the display region; a thin-film encapsulation layer sealing the display; a voltage line at the non-display region and surrounding the display region; and a dam unit overlapping an edge of an outer side of the voltage line, wherein the voltage line comprises: a first voltage line at one side of the display region; and a second voltage line surrounding a pair of first end portions of the first voltage line and other sides of the display region, and an outer side of the first voltage line and an outer side of the second voltage line are on a same line outside the one side of the display region.

The second voltage line may include a pair of second end portions bent to cover outer sides of the pair of first end portions, and each of the pair of first end portions may be between the display region and the pair of second end portions.

A first width of the first voltage line between the pair of first end portions may be greater than a second width of the pair of first end portions.

The outer side of the first voltage line may be between the pair of first end portions, and the outer side of the second voltage line may be between the pair of second end portions.

Outside the one side of the display region, the dam unit may be continuously formed at an edge of the outer side of the first voltage line and an edge of the outer side of the second voltage line.

The first voltage line may include a pair of first connection units, and a pair of second connection units may be on the pair of second end portions to be parallel to the pair of first connections.

The display may further include a pad unit configured to supply an electric signal to the display region, the pad unit may be outside the at least one side of the display region, and the pair of first connection units and the pair of second connection units may be connected to the pad unit.

The thin-film encapsulation layer may include at least one inorganic film and at least one organic film, and the at least one organic film may be inside the dam unit.

The thin-film encapsulation layer may include: a plurality of inorganic films; and a plurality of organic films between the plurality of inorganic films, and the plurality of inorganic films may be in contact with one another outside the dam unit.

The display may include: a thin-film transistor; an organic light-emitting device electrically connected to the thin-film transistor; a passivation film between the thin-film transistor and the organic light-emitting device; and a pixel defining film defining a pixel region of the organic light-emitting device, and the dam unit may include a same material as at least one of the passivation film and the pixel defining film.

The passivation film may overlap an edge of an inner side of the voltage line.

The organic light-emitting device may include: a first electrode electrically connected to the thin-film transistor; a second electrode opposite the first electrode; and an intermediate layer between the first and second electrodes.

The second electrode may be connected to the second voltage line.

The thin-film transistor may include: an active layer; a gate electrode; a source electrode; and a drain electrode, and a gate insulating film may be between the active layer and the gate electrode, an interlayer insulating film may be between the gate electrode, the source electrode, and the drain electrode, the gate insulating film and the interlayer insulating film may extend to the non-display region, the thin-film encapsulation layer may include at least one inorganic film, and the at least one inorganic film may be in contact with the gate insulating film or the interlayer insulating film outside the dam unit.

The at least one inorganic film may pass an end portion of the interlayer insulating film and then contact an upper surface of the substrate.

BRIEF DESCRIPTION OF THE DRAWINGS

These and/or other aspects will become apparent and more readily appreciated from the following description of the example embodiments, taken in conjunction with the accompanying drawings in which.

DETAILED DESCRIPTION

Reference will now be made in detail to example embodiments, examples of which are illustrated in the accompanying drawings, wherein like reference numerals refer to like elements throughout. In this regard, the present example embodiments may have different forms and should not be construed as being limited to the descriptions set forth herein. Accordingly, the example embodiments are merely described below, by referring to the figures, to explain aspects of the present description. It would be obvious to those of ordinary skill in the art that example embodiments are to cover all modifications, equivalents, and alternatives falling within the scope of the present invention. In the following description, well-known functions or constructions may not be described in detail if it is determined that they would obscure the inventive concept due to unnecessary detail.

It will be understood that although the terms "first", "second", etc. may be used herein to describe various components, these components should not be limited by these terms. These terms are only used to distinguish one component from another.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. In the drawings, elements may be exaggerated, omitted, or schematically illustrated for convenience of explanation. In other words, because sizes and thicknesses of components in the drawings are arbitrarily illustrated for convenience of explanation, the following embodiments are not limited thereto.

It will be understood that when a layer, region, or component is referred to as being "formed on or under," another layer, region, or component, it can be directly or indirectly formed on or under the other layer, region, or component. That is, for example, intervening layers, regions, or components may be present.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

Hereinafter, example embodiments will be described in more detail with reference to the accompanying drawings. In the drawings, components that are substantially the same or that correspond to each other will be denoted by the same reference numeral and will not be redundantly described here.

As used herein, the term "and/or" includes any and all combinations of one or more of the associated listed items. Expressions such as "at least one of," when preceding a list of elements, modify the entire list of elements and do not modify the individual elements of the list.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

Figure 1:
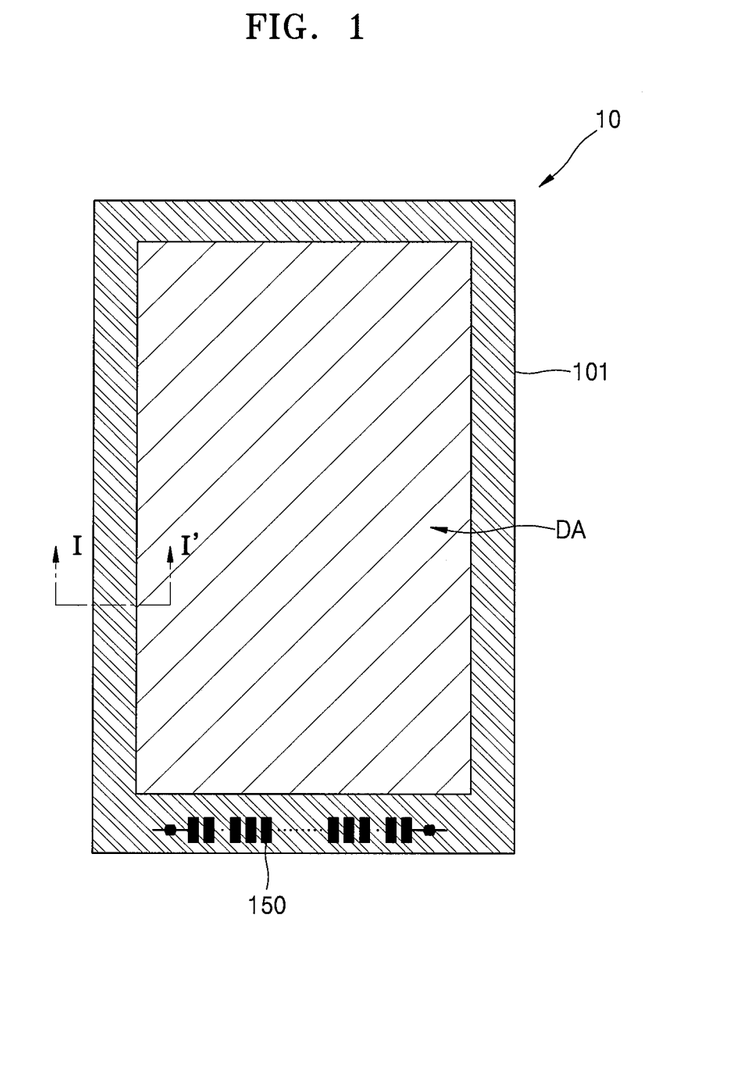
FIG. 1 is a schematic plan view of an organic light-emitting display device according to an example embodiment.
Figure 2:
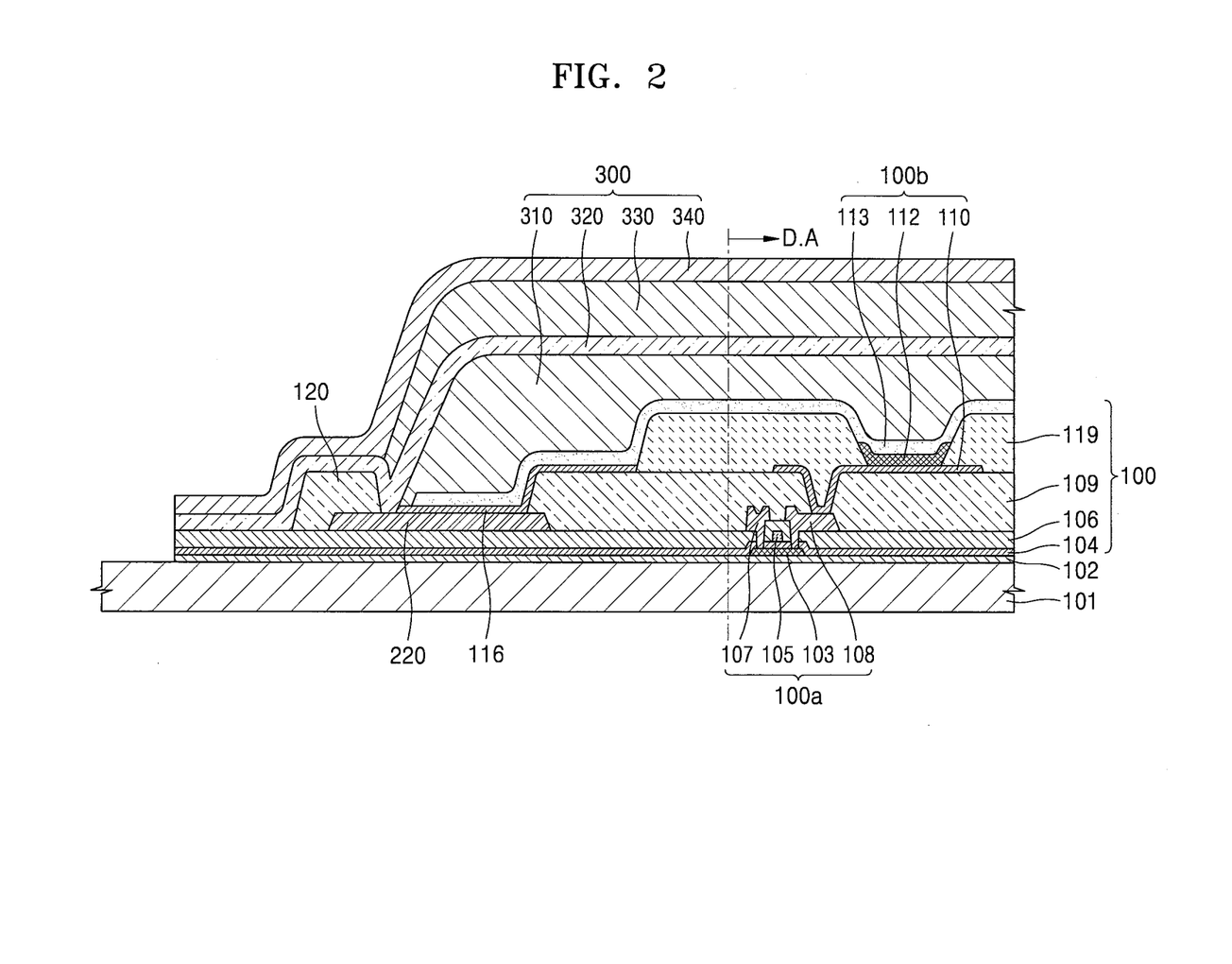
FIG. 2 is a schematic cross-sectional view taken along the line I-I' of FIG. 1.
Figure 3:
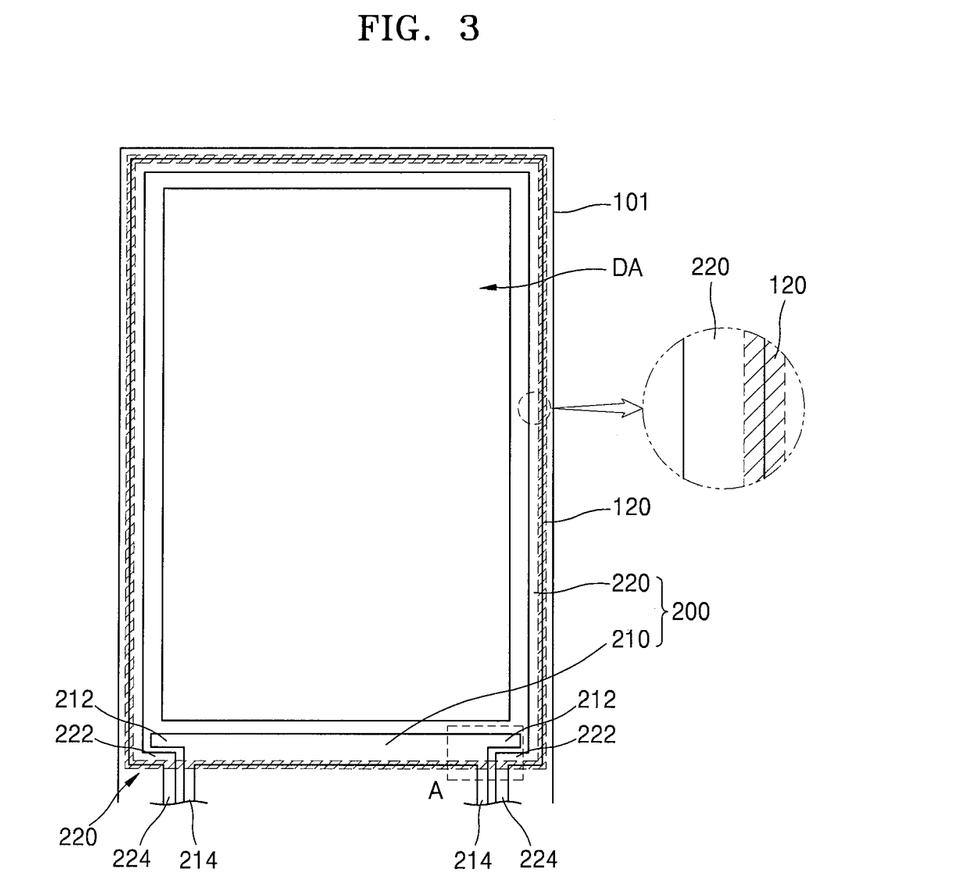
FIG. 3 is a schematic plan view of a voltage line and a dam unit of the organic light-emitting display device of FIG. 1.
Figure 4:
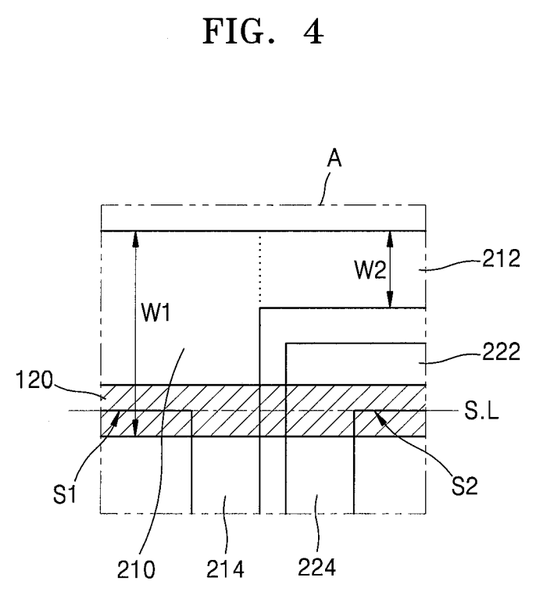
FIG. 4 is a schematic enlarged view of the region A of FIG. 3.

FIG. 1 is a schematic plan view of an organic light-emitting display device 10 according to an example embodiment. FIG. 2 is a schematic cross-sectional view taken along the line I-I' of FIG. 1. FIG. 3 is a schematic plan view of a voltage line 200 and a dam unit (or dam) 120 of the organic light-emitting display device of FIG. 1. FIG. 4 is a schematic enlarged view of the region A of FIG. 3.

Referring to FIGS. 1 to 4, according to an example embodiment, the organic light-emitting display device 10 may include a substrate 101, a display unit (or display) 100 on the substrate 101, and a thin-film encapsulation layer 300 for sealing the display unit 100.

The substrate 101 may include various materials. For example, the substrate 101 may be formed of a $SiO_2$-based transparent glass material but is not limited thereto, and may include any suitable substrate or transparent substrate materials according to the design of the organic light-emitting display device 10. For example, the substrate 101 may be formed of a transparent plastic material. The plastic material may be an organic material selected from the group consisting of polyethersulphone (PES), polyacrylate (PAR), polyetherimide (PEI), polyethylene napthalate (PEN), polyethyleneterepthalate (PET), polyphenylene sulfide (PPS), polyallylate, polyimide, polycarbonate (PC), cellulose triacetate (TAC), and cellulose acetate propionate (CAP) which are insulating organic materials.

When the organic light-emitting display device 10 is a bottom emission type in which an image is formed in a direction of the substrate 101, the substrate 101 should be formed of a transparent material. However, when the organic light-emitting display device 10 is a top emission type in which an image is formed in a direction opposite the substrate 101, the substrate 101 need not be formed of a transparent material. In this case, the substrate 101 may be formed of a metal. When the substrate 101 is formed of a metal, the substrate 101 may include, but is not limited to, at least one selected from the group consisting of iron, chromium, manganese, nickel, titanium, molybdenum, stainless steel (SUS), Invar alloy, Inconel alloy, and Kovar alloy.

The display unit 100 may be formed or arranged on the substrate 101. The display unit 100 may include a display region DA in which an image is displayed to be visible to a user, and a non-display region which is outside the perimeter (e.g., outside a footprint) of the display region DA. An organic light-emitting device 100b may be positioned in the display region DA, and a voltage line 200 may be arranged in the non-display region to supply power to the organic light-emitting device 100b. In the non-display region, a pad unit (or pad) 150 may be further positioned to transmit an electric signal to the display region DA from a power supply device or a signal generation device. The display unit 100 will be described in more detail with reference to FIG. 2 below.

A buffer layer 102 may be formed on the substrate 101. The buffer layer 102 may provide a flat surface (e.g., a planarized surface) on the substrate 101 and block foreign substances or moisture from permeating the substrate 101. For example, the buffer layer 102 may include silicon oxide, silicon nitride, silicon oxynitride, aluminum oxide, aluminum nitride, titanium oxide, titanium nitride, etc. (which are inorganic materials), polyimide, polyester, acryl, etc. (which are organic materials), or a stack structure including a plurality of materials among the above materials. The buffer layer 102 is formed on the display region DA to extend to (e.g., extend over or overlapping) the non-display region.

The display region DA may have, for example, a rectangular shape. A thin-film transistor TFT 100a and the organic light-emitting device electrically connected to the TFT 100a may be positioned in the display region DA.

The TFT 100a may include an active layer 103, a gate electrode 105, a source electrode 107, and a drain electrode 108.

The TFT 100a is a top gate type in which the active layer 103, the gate electrode 105, the source electrode 107, and the drain electrode 108 are sequentially formed. However, example embodiments are not limited thereto and other various types of TFTs such as a bottom gate type may be employed as the TFT 100a.

The active layer 103 is formed on the buffer layer 102. The active layer 103 includes a semiconductor material, e.g., amorphous silicon or polycrystalline silicon. However, example embodiments are not limited thereto and the active layer 103 may include other various materials. In an alternative embodiment, the active layer 103 may include an organic semiconductor material, etc.

In another alliterative embodiment, the active layer 103 may include an oxide semiconductor material. For example, the active layer 103 may include an oxide of a material selected from the group consisting of a Group XII, XIII, or XIV metal element such as zinc (Zn), indium (In), gallium (Ga), tin (Sn), cadmium (Cd), germanium (Ge), or a combination thereof.

A gate insulating film 104 is formed on the active layer 103. The gate insulating film 104 may be formed in a single layer or multiple layers using inorganic materials such as silicon oxide and/or silicon nitride. The gate insulating film 104 insulates the active layer 103 and the gate electrode 105 from each other. The gate insulating film 104 may extend to not only the display region DA but also a portion of the non-display region.

The gate electrode 105 is formed on the gate insulating film 104. The gate electrode 105 may be connected to a gate line through which an 'on'/'off' signal is supplied to the TFT 100a.

The gate electrode 105 may be formed of a low-resistance metal material. The gate electrode 105 may be formed in a single layer or multiple layers using, for example, at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu), in consideration of an adhesive strength between the gate electrode 105 and a layer adjacent thereto, the surface flatness and processability of stacked layers, etc.

An interlayer insulating film 106 is formed on the gate electrode 105. The interlayer insulating film 106 insulates the source electrode 107, the drain electrode 108, and the gate electrode 105 from one another. The interlayer insulating film 106 may extend to not only the display region DA but also a portion of the non-display region.

The interlayer insulating film 106 may be formed in a single layer or multiple layers using an inorganic material. For example, the inorganic material may be metal oxide or metal nitride. In detail, the inorganic material may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), zinc oxide ($ZrO_2$), etc.

The source electrode 107 and the drain electrode 108 are formed on the interlayer insulating film 106. The source electrode 107 and the drain electrode 108 may be each formed in a single layer or multiple layers using at least one material selected from the group consisting of aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The source electrode 107 and the drain electrode 108 are formed to be in contact with a region of the active layer 103.

A passivation film 109 may be formed to cover the TFT 100a. The passivation film 109 may remove a step caused by the TFT 100a and planarize an upper surface of a resultant structure to prevent the organic light-emitting device 100b from malfunctioning due to a lower concavo-convex structure.

The passivation film 109 may be formed in a single layer or multiple layers using an organic material. The organic material may include a general-purpose polymer such as polymethylmethacrylate (PMMA) or polystylene (PS), a polymeric derivative having a phenol-based group, an acryl-based polymer, an imide-based polymer, an arylether-based polymer, an amide-based polymer, a fluorine-based polymer, a p-xylene-based polymer, a vinyl alcohol-based polymer, or a mixture thereof. Also, the passivation film 109 may be a stack structure including an inorganic insulating film and an organic insulating film.

The organic light-emitting device 100b is formed on the passivation film 109. The organic light-emitting device 100b is electrically connected to the TFT 100a, and includes a first electrode 110, a second electrode 113 arranged opposite the first electrode 110, and an intermediate layer 112 present between the first and second electrodes 110 and 113.

The first electrode 110 may be electrically connected to the drain electrode 108. The first electrode 110 may be formed in various shapes. For example, the first electrode 10 may be patterned in an island fashion.

The first electrode 110 may be formed on the passivation film 109 and electrically connected to the TFT 100a via a contact hole formed in the passivation film 109. For example, the first electrode 110 may be a reflective electrode. For example, the first electrode 110 may include a reflective film formed of Ag, Mg, Al, Pt, Pd, Au, Ni, Nd, Ir, Cr, or a combination thereof, and a transparent or semi-transparent electrode layer formed on the reflective film. The transparent or semi-transparent electrode layer may include at least one selected from the group consisting of indium tin oxide (ITO), indium zinc oxide (IZO), zinc oxide (ZnO), indium oxide ($In_2O_3$), indium gallium oxide (IGO), and aluminum zinc oxide (AZO).

The second electrode 113 arranged opposite the first electrode 110 may be a transparent or semi-transparent electrode, and may be formed of a metal thin film with a low work function such as Li, Ca, LiF/Ca, LiF/Al, Al, Ag, Mg, or a combination thereof. An auxiliary electrode layer or a bus electrode may be further formed on the metal thin film by using a material for forming a transparent electrode, e.g., ITO, IZO, ZnO, $In_2O_3$, or the like. Thus, the second electrode 113 may allow light emitted from the organic emission layer included in the intermediate layer 112 to pass therethrough. That is, the light emitted from the organic emission layer may be reflected directly or via the first electrode 110 which is a reflective electrode, and emitted toward the second electrode 113.

However, the display unit 100 according to the present embodiment is not limited to the top emission type and may be a bottom emission type in which light emitted from the organic emission layer is emitted toward the substrate 101. In this case, the first electrode 110 may be a transparent or semi-transparent electrode and the second electrode 113 may be a reflective electrode. Also, the display unit 100 according to the present embodiment may be a dual emission type in which light is emitted in both directions of front and bottom surfaces thereof.

A pixel defining film 119 formed of an insulating material is positioned on the first electrode 110. The pixel defining film 119 may be formed of at least one organic insulating material selected from the group consisting of polyimide, polyamide, acryl resin, benzocyclobutene, and phenol resin by spin coating or the like. The pixel defining film 119 exposes a region of the first electrode 110 and the intermediate layer 112 with the organic emission layer is present on the exposed region of the first electrode 110. That is, the pixel defining film 119 defines a pixel region of the organic light-emitting device 10b.

The organic emission layer included in the intermediate layer 112 may include a low molecular weight organic material or a high molecular weight organic material. The intermediate layer 112 may selectively further include a functional layer such as a hole transport layer (HTL), a hole injection layer (HIL), an electron transport layer (ETL), an electron injection layer (EIL), etc.

In the non-display region which is the perimeter of the display region DA, the voltage line 200 and the dam unit 120 may be arranged to surround the display region DA.

The voltage line 200 may be formed of the same material as the source electrode 107 and the drain electrode 108. The voltage line 200 may include a first voltage line 210 and a second voltage line 220. For example, the first voltage line 210 may be a driving voltage ELVDD line and the second voltage line 220 may be a common voltage ELVSS line. The second voltage line 220 may be connected to the second electrode 113. Although FIG. 2 illustrates that the second voltage line 220 and the second electrode 113 are connected via a wire 116, example embodiments are not limited thereto and the second voltage line 220 and the second electrode 113 may be directly in contact with each other.

The first voltage line 210 may be arranged to correspond to at least one side of the display region DA. The first voltage line 210 may be arranged in parallel to one side of the display region DA and has a length equal to or greater than the length of the side of the display region DA. In this case, the side of the display region DA corresponding to the first voltage line 210 may be located adjacent to the pad unit 150. The second voltage line 220 may surround a pair of first end portions 212 of the first voltage line 210 and the other sides of the display region DA.

Outside the side of the display region DA, an outer side S1 of the first voltage line 210 and an outer side S2 of the second voltage line 220 may be positioned on the same line S.L. For example, the second voltage line 220 may include a pair of second end portions 222 that are bent to cover the outer sides of the pair of first end portions 212. Each of the pair of first end portions 212 may be present between the display region DA and the pair of second end portions 222. In this case, a first width W1 of the first voltage line 210 between the pair of first end portions 212 may be greater than a second width W2 of the pair of first end portions 212. Thus, the outer side S1 of the first second voltage line 210 may be present between the pair of first end portions 212, and the outer side S2 of the second voltage line 220 between the pair of second end portions 222.

The first voltage line 210 may include a pair of first connection units (or connections) 214. The second voltage line 220 may include a pair of second connection units 224. The pair of first connection units 214 may extend from the pair of first end portions 212 in a direction perpendicular to the pair of first end portions 212. The pair of second connection units 224 may extend from the pair of second end portions 222 to be parallel to the pair of first connection units 214. The pair of first connection units 214 and the pair of second connection units 224 may be connected to the pad unit 150 outside the at least one side of the display region DA.

The dam unit 120 may be formed to overlap at least an edge of an outer side of the voltage line 200. An edge of an inner side of the voltage line 200 may overlap the passivation film 109.

The dam unit 120 may prevent or reduce an organic material from flowing along an edge of the substrate 101 when organic films 310 and 330 of the thin-film encapsulation layer 300 for sealing the display unit 100 are formed, thereby preventing or reducing instances of edge tails of the organic films 310 and 330 from being formed.

The dam unit 120 may be formed of the same material as the passivation film 109 or the pixel defining film 119. As described above, the passivation film 109 and the pixel defining film 119 may be formed of an organic material. An adhesive strength between the organic material and a metal is greater than that between the organic material and an inorganic material of the gate insulating film 104 and/or the interlayer insulating film 106. Thus, the dam unit 120 may be formed to overlap at least the edge of the outer side of the voltage line 200 formed of a metal material, so that the dam unit 120 may be stably formed to have a high adhesive strength.

Because the voltage line 200 surrounds the display region DA, the dam unit 120 may also surround the entire display region DA. In detail, the dam unit 120 may be formed along the second voltage line 220 to surround the display region DA, and continuously formed because the dam unit 120 overlaps at least the edge of the outer side S1 of the first voltage line 210 and the edge of the outer side S2 of the second voltage line 220 outside a side of the dam unit 120 corresponding to the first voltage line 210.

When the entire first voltage line 210 has the second width W2, the outer side S1 of the first voltage line 210 is shifted to the display region DA. Thus, the dam unit 120 does not overlap the first voltage line 210 and is in contact with the gate insulating film 104 or the interlayer insulating film 106 below the dam unit 120. Thus, the dam unit 120 may be difficult to form. Even if the dam unit 120 is formed on the gate insulating film 104 or the interlayer insulating film 106, delamination or the like may occur and external contaminants §uch as moisture or oxygen may permeate via the dam unit 120. Thus, errors such as dark spots may occur in the organic light-emitting display device 10.

However, according to an example embodiment, the outer side S1 of the first voltage line 210 and the outer side S2 of the second voltage line 220 are present on the same line S.L outside a side of the display region DA adjacent to the pad unit 150. Thus, because the dam unit 120 may be formed to surround the entire display region DA, a characteristic of blocking external contaminants such as moisture or oxygen may be enhanced.

Although FIG. 2 illustrates that the dam unit 120 overlaps an edge of an outer side of the voltage line 200, example embodiments are not limited thereto and the dam unit 120 may be formed only on the voltage line 200 or formed to cover the voltage line 200.

Also, although FIG. 2 illustrates that the dam unit 120 is formed in a single layer, example embodiments are not limited thereto. That is, the dam unit 120 may be formed in two or more layers. For example, when the dam unit 120 has a two-layer structure, a lower layer may formed of the same material as the passivation film 109 and an upper layer may be formed of the same material as the pixel defining film 119. Also, two or more dam units 120 may be used. When a plurality of dam units 120 are used, the height of the dam unit 120 may increase as the dam unit 120 becomes adjacent to the exterior of the substrate 101.

The thin-film encapsulation layer 300 may seal the display unit 100 to prevent or reduce external contaminants such as oxygen, moisture, etc., from permeating the display unit 100. The thin-film encapsulation layer 300 may include a plurality of organic films 310 and 330 and a plurality of inorganic films 320 and 340. The plurality of organic films 310 and 330 and the plurality of inorganic films 320 and 340 may be alternately stacked to form a multilayer structure. Although FIG. 2 illustrates that the thin-film encapsulation layer 300 includes two organic films 310 and 330 and two inorganic films 320 and 340, example embodiments are not limited thereto. That is, the thin-film encapsulation layer 300 may further include a plurality of additional inorganic encapsulation films and a plurality of additional organic encapsulation films that are alternately arranged. A number of times that the plurality of additional inorganic encapsulation film and the plurality of additional organic encapsulation film are alternately stacked is not limited.

The organic films 310 and 330 may each include, for example, at least one material selected from the group consisting of acryl-based resin, methacryl-based resin, polyisoprene, vinyl-based resin, epoxy-based resin, urethane-based resin, cellulose-based resin, and perylene-based resin.

The dam unit 120 may prevent or reduce instances of an organic material flowing along an edge of the substrate 101 when the organic films 310 and 330 are formed, and thus the organic films 310 and 330 are formed inside the dam unit 120.

The inorganic films 320 and 340 may each include, for example, at least one material selected from the group consisting of silicon nitride, aluminum nitride, zirconium nitride, titanium nitride, hafnium nitride, tantalum nitride, silicon oxide, aluminum oxide, titanium oxide, tin oxide, cerium oxide, and silicon oxynitride (SiON).

The inorganic films 320 and 340 may be formed to be larger than the organic films 310 and 330 and to cover the dam unit 120. The inorganic films 320 and 340 may extend to the outside of the dam unit 120, and may be in contact with each other outside the dam unit 120. At least one of the inorganic films 320 and 340 may be in contact with the gate insulating film 104 or the interlayer insulating film 106 outside the dam unit 120. Thus, external contaminants such as moisture or oxygen may be prevented or reduced from permeating side surfaces of the organic light-emitting display device 10 and an adhesive strength of the thin-film encapsulation layer 300 may be improved.

Outside the dam unit 120, at least one of the inorganic films 320 and 340 may pass an end portion of the interlayer insulating film 106 and be then in contact with an upper surface of the substrate 101 and may also be in contact with side surfaces of the gate insulating film 104 and the interlayer insulating film 106. Thus, the encapsulation characteristics of the thin-film encapsulation layer 300 may be prevented from being degraded or disappearing due to laminating edges of the inorganic films 320 and 340.

As described above, according to the one or more of the above example embodiments, in an organic light-emitting display device, an edge tail of an organic film of a thin-film encapsulation layer may be prevented from being formed, thereby protecting the organic light-emitting display device against external contaminants such as moisture or oxygen.

It should be understood that example embodiments described herein should be considered in a descriptive sense only and not for purposes of limitation. Descriptions of features or aspects within each example embodiment should typically be considered as available for other similar features or aspects in other example embodiments.

While one or more example embodiments have been described with reference to the figures, it will be understood by those of ordinary skill in the art that various changes in form and details may be made therein without departing from the spirit and scope as defined by the following claims, and their equivalents.

What is claimed is:

1. An organic light-emitting display device comprising:
a substrate;
a display on the substrate and comprising a display region and a non-display region at a perimeter of the display region;
a thin-film encapsulation layer sealing the display;
a voltage line at the non-display region and surrounding the display region; and
a dam unit overlapping an edge of an outer side of the voltage line,
wherein the voltage line comprises:
a first voltage line at one side of the display region; and
a second voltage line surrounding a pair of first end portions of the first voltage line and other sides of the display region, and
an outer side of the first voltage line and an outer side of the second voltage line are on a same line outside the one side of the display region.

2. The organic light-emitting display device of claim 1, wherein the second voltage line comprises a pair of second end portions bent to cover outer sides of the pair of first end portions, and
each of the pair of first end portions is between the display region and the pair of second end portions.

3. The organic light-emitting display device of claim 2, wherein a first width of the first voltage line between the pair of first end portions is greater than a second width of the pair of first end portions.

4. The organic light-emitting display device of claim 2, wherein the outer side of the first voltage line is between the pair of first end portions, and
the outer side of the second voltage line is between the pair of second end portions.

5. The organic light-emitting display device of claim 4, wherein, outside the one side of the display region, the dam unit is continuously formed at an edge of the outer side of the first voltage line and an edge of the outer side of the second voltage line.

6. The organic light-emitting display device of claim 2, wherein the first voltage line comprises a pair of first connection units, and
 a pair of second connection units are on the pair of second end portions to be parallel to the pair of first connections.

7. The organic light-emitting display device of claim 6, wherein the display further comprises a pad unit configured to supply an electric signal to the display region,
 wherein the pad unit is outside the at least one side of the display region, and
 the pair of first connection units and the pair of second connection units are connected to the pad unit.

8. The organic light-emitting display device of claim 1, wherein the thin-film encapsulation layer comprises at least one inorganic film and at least one organic film,
 wherein the at least one organic film is inside the dam unit.

9. The organic light-emitting display device of claim 1, wherein the thin-film encapsulation layer comprises:
 a plurality of inorganic films; and
 a plurality of organic films between the plurality of inorganic films,
 wherein the plurality of inorganic films are in contact with one another outside the dam unit.

10. The organic light-emitting display device of claim 1, wherein the display comprises:
 a thin-film transistor;
 an organic light-emitting device electrically connected to the thin-film transistor;
 a passivation film between the thin-film transistor and the organic light-emitting device; and
 a pixel defining film defining a pixel region of the organic light-emitting device,
 wherein the dam unit comprises a same material as at least one of the passivation film and the pixel defining film.

11. The organic light-emitting display device of claim 10, wherein the passivation film overlaps an edge of an inner side of the voltage line.

12. The organic light-emitting display device of claim 10, wherein the organic light-emitting device comprises:
 a first electrode electrically connected to the thin-film transistor;
 a second electrode opposite the first electrode; and
 an intermediate layer between the first and second electrodes.

13. The organic light-emitting display device of claim 12, wherein the second electrode is connected to the second voltage line.

14. The organic light-emitting display device of claim 10, wherein the thin-film transistor comprises:
 an active layer;
 a gate electrode;
 a source electrode; and
 a drain electrode,
 wherein a gate insulating film is between the active layer and the gate electrode,
 an interlayer insulating film is between the gate electrode, the source electrode, and the drain electrode,
 wherein the gate insulating film and the interlayer insulating film extend to the non-display region, and
 the thin-film encapsulation layer comprises at least one inorganic film,
 wherein the at least one inorganic film is in contact with the gate insulating film or the interlayer insulating film outside the dam unit.

15. The organic light-emitting display device of claim 14, wherein the at least one inorganic film passes an end portion of the interlayer insulating film and then contacts an upper surface of the substrate.

* * * * *